(12) United States Patent
Ahn

(10) Patent No.: US 6,949,417 B1
(45) Date of Patent: Sep. 27, 2005

(54) LIQUID CRYSTAL DISPLAY AND METHOD OF MANUFACTURING THE SAME

(75) Inventor: Byung Chol Ahn, Kumi-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/567,761

(22) Filed: May 9, 2000

Related U.S. Application Data

(62) Division of application No. 08/993,195, filed on Dec. 18, 1997, now Pat. No. 6,288,414.

(30) Foreign Application Priority Data

Mar. 5, 1997 (KR) ............................................. P97-7226

(51) Int. Cl.$^7$ ............................................. H01L 21/00
(52) U.S. Cl. ........................ 438/149; 438/30; 438/652; 438/656; 438/688; 257/347
(58) Field of Search ........................ 438/149, 30, 652, 438/656, 688, 151; 257/347

(56) References Cited

U.S. PATENT DOCUMENTS

| | | | | |
|---|---|---|---|---|
| 5,688,719 A | * | 11/1997 | Tsai et al. | 438/780 |
| 5,883,682 A | * | 3/1999 | Kim et al. | 349/43 |
| 5,982,467 A | * | 11/1999 | Lee | 349/138 |
| 6,069,019 A | * | 5/2000 | Ishii et al. | 438/30 |
| 6,087,678 A | * | 7/2000 | Kim | 257/59 |
| 6,163,356 A | * | 12/2000 | Song et al. | 349/152 |

FOREIGN PATENT DOCUMENTS

| | | |
|---|---|---|
| JP | 3-58030 | 3/1991 |
| JP | 3-149819 | 6/1991 |
| JP | 5-291256 | 11/1993 |

* cited by examiner

Primary Examiner—Trung Dang
(74) Attorney, Agent, or Firm—McKenna Long & Aldridge LLP

(57) ABSTRACT

In manufacturing an active panel of a liquid crystal display, when a pad portion to which outer driving signals are applied is formed, oxide or nitride layer is generated on the surface of the pads. Since these oxide and nitride layers have a high intrinsic resistance, they cause a reliability of the signal transmission in the pad portion to be decreased. The present invention provides a method for enhancing the reliability of the signal transmission in the pad portion by removing contaminants such as oxide layer and nitride layer and reducing the contact resistance of the pad portion. The present inversion also provides a method for maintaining a good adhesion by forming a surface of the pad portion in an uneven shape and by increasing the contact area. The pad is formed from dual metal layer made by depositing sequentially a first metal layer and a second metal layer. A protection layer is formed by depositing an insulation material such a silicon oxide or silicon nitride on the entire surface of the substrate on which the pad is formed. By etching the protection layer using dry etching method, a pad contact hole is formed on the pad. The second metal of the pad is removed by wet etching method, using the pad contact hole as mask. By doing so, the contaminants between the metal layer and the protection layer can be completely removed. Further, the present invention can have a plurality of pad contact holes to enlarge the contact area between the pad and the pad terminal, and thereby enhancing adhesion between the pad and the pad terminal.

9 Claims, 10 Drawing Sheets

LIQUID CRYSTAL DISPLAY AND METHOD OF MANUFACTURING THE SAME

This application is a divisional of U.S. application Ser. No. 08/993,195, filed Dec. 18, 1997, now U.S. Pat. No. 6,288,414 the entire disclosure of which is considered to be part of the disclosure of the accompanying application and is hereby incorporated by reference therein.

This application claims the benefit of Korean patent application No. P97-7226, filed Mar. 5, 1997, which is hereby incorporated by reference.

BACKGROUND OF THE INVENTION

1. Field of the Invention

The present invention relates to a method for manufacturing a pad terminal for inputting or outputting electrical signals. More particularly, the present invention relates to a structure of the pad terminal to an electrical circuit board or a liquid crystal display device, and a method of manufacturing of the pad terminal.

2. Description of the Background Art

Generally, most electrical circuit boards have pad terminals for inputting or outputting electrical signals. These pad terminals are usually made simultaneously with the rest of the circuit board. Also, an LCD display comprising thin film transistors (TFT's) or other electrical elements has pad terminals similar to ordinary electric circuit boards. The LCD comprises a color filler panel for representing the color of a picture, and an active panel driving a pixel array by applying a data signal corresponding to the picture. These two panels are joined to each other with a narrow gap in between, and a liquid crystal material is injected into the gap. When driving signals are applied to the pad terminals of the active panel, the TFT's of the active panel drive the liquid crystal, thus displaying an image.

The color filter panel comprises a red color filter, a green color filter, and a blue color filter which are arrayed in sequence. A black matrix is located between the color filters in a mesh pattern. A common electrode is formed on the black matrix. The active panel comprises pixel electrodes at the pixels arrayed on the transparent substrate in a matrix pattern. A scan line is formed along the horizontal direction of the pixel array, and a data line is formed along the vertical direction of the pixel array. At one corner of the pixel, a thin film transistor is formed for driving the pixel electrode. The gate electrode is connected to the scan line (sometimes referred to as a 'gate line'), and the source electrode is connected to the data line (sometimes referred to as a 'source line'). A pad terminal is formed at the end portion of each line.

The scan signal and the data signal are applied to the active panel through the pad terminals. The scan signal is used for selecting the horizontal scan line and has a frequency from 30 Hz to 60 Hz. The data signal normally represents an image. By selecting one scan line using the scan signal, the data signal of the scan line can be displayed on the LCD panel.

The signal applied to the pad terminal is an electrical signal. If there are particles or contaminants between the pad terminal and the output terminal of the outer device, or if the electrical contact between them is poor, then the quality of the image on the LCD screen may degrade. Therefore, the process of forming a pad terminal is very important for maintaining the quality of the image. The conventional method for manufacturing the pad terminal and the structure of the LCD will now be described.

FIG. 1 shows the plan view of the conventional structure of an LCD. FIGS. 2a–2f are the cross-sectional views showing the conventional process for manufacturing the TFT, the gate line and the gate pad of an LCD along the line II—II.

A metal layer having low resistance such as aluminum or an aluminum alloy is deposited on a transparent substrate 11. A gate electrode 13, a gate line 15, a gate pad 17, and a source pad 37 are formed by patterning the metal layer using a photolithographic method, as shown in FIG. 2a. The gate electrode 13 is formed at one corner of the pixel. The gate line 15 connects the gate electrodes 13 arrayed to a row direction. The gate pad 17 is formed later at an end portion of the gate line 15 The source pad 37 is formed at an end portion of a source line 35.

A gate insulation layer 19 is formed by depositing an insulation material such as silicon nitride or silicon oxide on the substrate having the gate electrode 13, the gate line 15 and the gate pad 17. An intrinsic semiconductor material and a doped semiconductor material are sequentially deposited on the gate insulation layer 19. By patterning them, a semiconductor layer 21 and a doped semiconductor layer 23 are formed, as shown in FIG. 2b.

A first gate pad contact hole 61 and a first source pad contact hole 71 are formed by patterning the gate insulation layer 19, as shown in FIG. 2c. The first gate pad contact hole 61 exposes the gate pad 17 by etching the gate insulation layer 19 covering the gate pad 17. The first source pad contact hole 71 exposes the source pad 37 by etching the gate insulation layer 19 covering the source pad 37.

A metal such as chromium or a chromium alloy is deposited on the substrate having the doped semiconductor layer 23. A source electrode 33, a drain electrode 43, a source line 35, a source pad intermediate electrode 77, and a gate pad intermediate electrode 67 are formed by patterning the metal layer, as shown in FIG. 2d. The source electrode 33 contacts one side of the semiconductor layer 21 and the doped semiconductor layer 23, which acts as a source region. The source line 35 connects to the source electrodes 33 arrayed in a column direction. The drain electrode 43 is on the other side of the doped semiconductor layer 23 from the source electrode 33, and connects to the other side of the semiconductor layer 21 and the doped semiconductor layer 23, which acts as a drain region. The source pad intermediate electrode 77 is formed at the end of the source line 35 and connects to the source pad 37 through the first source pad contact hole 71. The gate pad intermediate electrode 67 connects to the gate pad 17 through the first gate pad contact hole 61.

A protection layer 39 is formed by depositing an insulation material such as silicon oxide or silicon nitride on the substrate having the source electrode 33. A drain contact hole 81, a second gate pad contact hole 87, and a second source pad contact hole 97 are formed by patterning the protection layer 39, as shown in FIG. 2e. The drain contact hole 81 exposes the drain electrode 43 by removing a portion of the protection layer 39 covering the drain electrode 43. The second gate pad contact hole 87 exposes the gate pad intermediate electrode 67 by removing a portion of the protection layer 39 covering the gate intermediate electrode 67. The source pad contact hole exposes the source intermediate electrode 77 by removing a portion of the protection layer 39 covering the source intermediate electrode 77.

A pixel electrode 53, a gate pad terminal 65, and a source pad terminal 75 are formed by depositing and patterning indium tin oxide (ITO) on the protection layer 39, as shown in FIG. 2f. The pixel electrode 53 connects to the drain electrode 43 through the drain contact hole 81. The gate pad terminal 65 connects to the gate pad intermediate terminal 67 through the second gate pad contact hole 87. The source pad terminal 75 connects to the source pad intermediate electrode 77 through the second source pad contact hole 97.

According to the conventional method, the gate pad 17 and the source pad 37 comprise aluminum, the gate and source pad intermediate electrodes 67 and 77 comprise chromium, and the gate source pad terminals 65 and 75 comprise ITO. Generally, when ITO is deposited by a sputtering method on the intermediate electrodes 67 and 77, it is sputtered in an oxygen atmosphere. At that time, chromium oxide can form on the surface of the intermediate electrodes 67 and 67. Also, the gate insulation layer or the protection layer comprising the silicon oxide or silicon nitride are formed on the pads or on the intermediate electrodes and patterned to form contact holes. When silicon oxide or silicon nitride is deposited on the surface of the metal layer a thin metal oxide layer or a thin metal nitride layer can form, resulting in a contact resistance between chromium and ITO that is higher than desired.

SUMMARY OF THE INVENTION

Accordingly, the present invention is directed to a liquid crystal display and method of manufacturing the same that substantially obviates one or more of the problems due to the limitations and disadvantages of the related art.

One object of the present invention is to keep contact resistance of a pad terminal surface of an active panel at a low level.

Another object of the present invention is to maintain the scan and data signals in their original state by keeping contact resistance of the pad terminal at a low level.

Yet another object of the present invention is to enhance the quality of a displayed image by maintaining the signals of the active panel in their original state.

To achieve these and other advantages, and in accordance with the purpose of the present invention, as embodied and broadly described, in a first aspect of the present invention there is provided a method for manufacturing a pad terminal for a semiconductor device including the steps of forming a first pad on a substrate using a first metal, forming a second pad covering the first pad using a second metal, forming a protection layer over the second pad, forming a pad contact hole through the protection layer exposing an exposed portion of the second pad; removing the exposed portion of the second pad using the pad contact hole as a mask thereby exposing an exposed portion of the first pad, and forming a conductive pad including a conductive material and connected to the exposed portion of the best pad.

In a second aspect of the present invention, there is provided a liquid crystal display device including a substrate; a first pad on the substrate; a second pad over a portion of the first pad, a protection layer on the second pad, and a pad terminal connected to a surface of the first pad and a side of the second pad.

In a third aspect of the present invention, there is provided a method for manufacturing a semiconductor display device including the steps of forming a gate line, a gate pad, and a gate electrode on a substrate, wherein the gate pad is located at an end portion of the gate line; forming a gate insulation layer over the substrate, the gate line, the gate pad and the gate electrode; forming a first semiconductor layer over a gate region; forming a doped semiconductor layer over the first semiconductor layer; forming a source electrode over a first portion of the doped semiconductor, a drain electrode over a second portion of the doped semiconductor layer, a source pad and a source line, wherein the source pad is located at an end portion of the source line; removing a part of the doped semiconductor layer over the gate electrode; forming a protection layer; patterning the protection layer to expose a portion of the gate pad, a portion of the source pad and a portion of the drain electrode; and forming a pixel electrode connected to the portion of the drain electrode; a gate pad terminal connected to the portion of the gate pad and a source pad terminal connected to the portion of the source pad.

It is to be understood that both the foregoing general description and the following detailed description are exemplary and explanatory and are intended to provide further explanation of the invention as claimed.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

Figure 6:
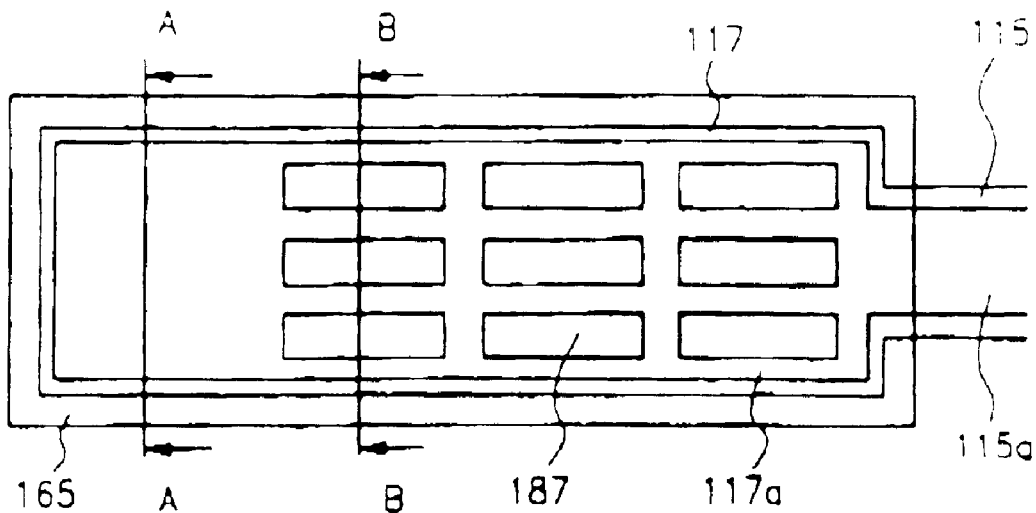

FIGS. 4a–f are cross-sectional views showing an example of a manufacturing process of an active panel of the present invention;

FIGS. 5a–5f are cross-sectional views showing another example of a manufacturing process of an active panel of the present invention;

FIG. 6 shows a plan view of a pad of the present invention.

Figure 7A:
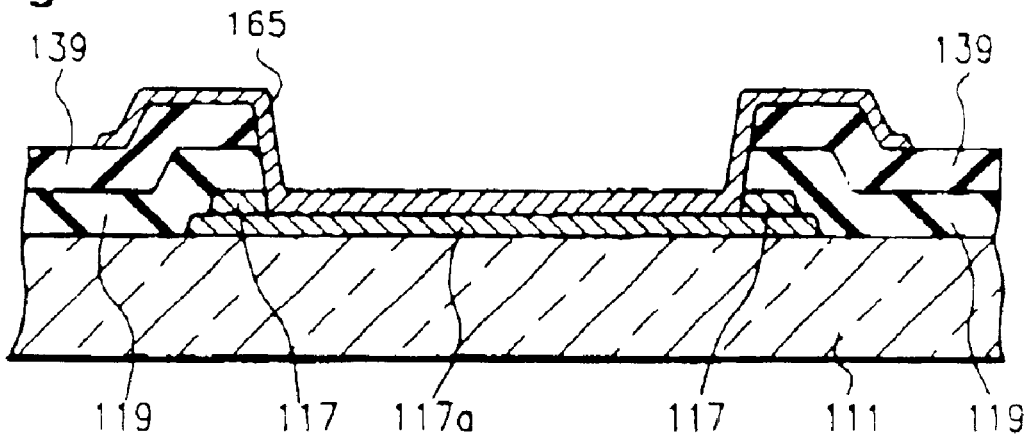
Figure 7B:
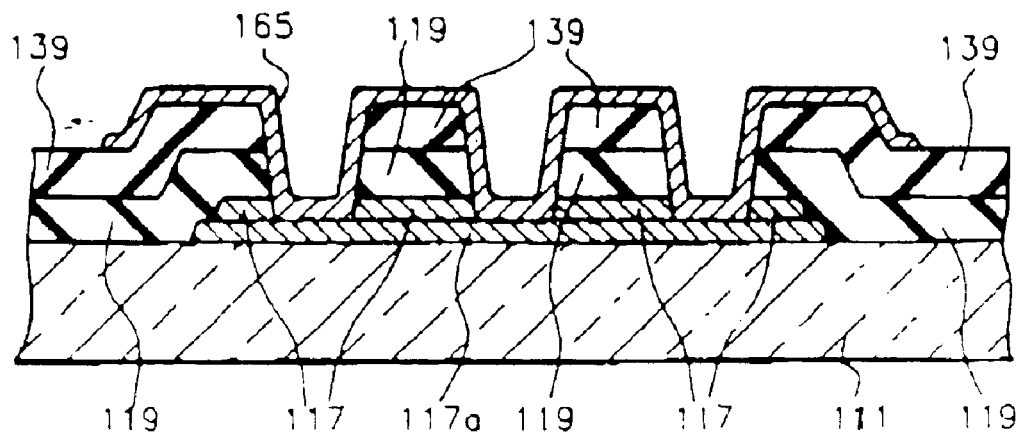
Figure 8A:
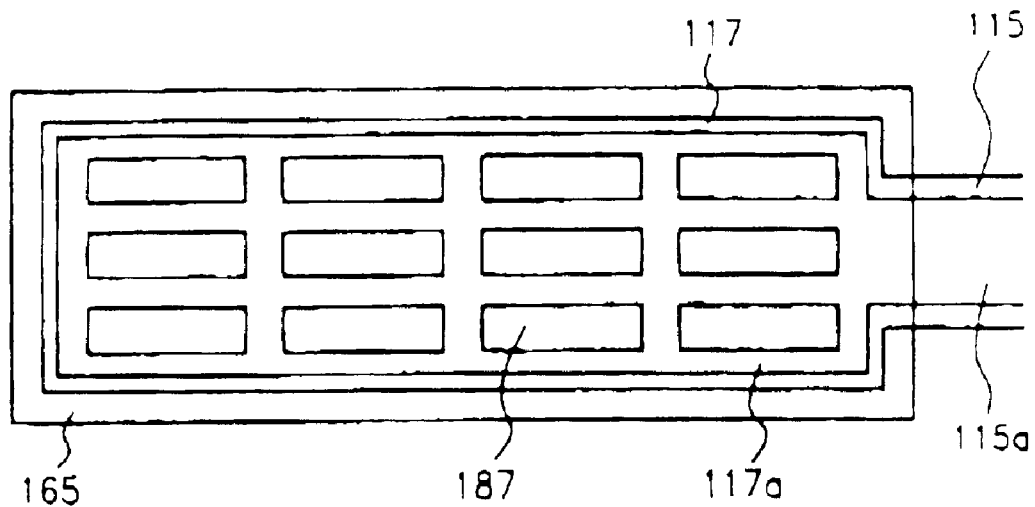
Figure 8B:
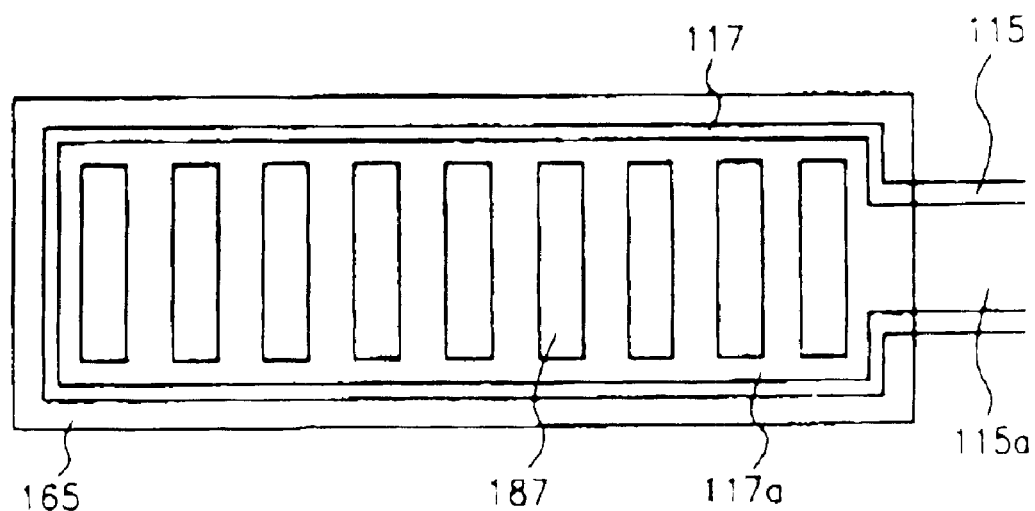

FIGS. 7a–7b are cross-sectional views showing a pad of the present invention, and FIGS. 8a–8b show another example of a pad structure of the present invention

DETAILED DESCRIPTION OF THE PREFERRED EMBODIMENTS

Reference will now be made in detail to the preferred embodiments of the present invention, examples of which are illustrated in the accompanying drawings.

The present invention relates to a method for maintaining contact resistance of a pad and the structure of the pad. The present invention prevents contamination by foreign materials, such as an oxidation layer or a nitrification layer, of the pad surface during the manufacture of an LCD active panel Thus, contact resistance does not increase due to the contaminating materials. Also, the pad surface may have a raised part and a depressed part, enlarging the total contact area of the pad. Therefore, contact resistance and adhesion between the pad and the pad terminal are improved. Thus, a high quality LCD panel can be manufactured.

The present invention therefore discloses a manufacturing method of an active panel where the pad terminal surface does not have a thin layer of particles which increase contact resistance. According to the present invention, the manufacturing method includes a step of forming a pad by depositing and patterning a first and a second metal layer on a substrate; forming a pad protection layer by depositing silicon oxide or silicon nitride on the pad; forming a pad contact hole by patterning the pad protection layer by using a dry etching method, removing by wet etching an exposed portion of the second metal layer through the pad contact hole; forming a pad terminal in contact with the pad through the pad contact hole by depositing and patterning an indium tin oxide layer on the pad protection layer. Therefore, the surface of the pad including the first metal does not have an oxide or a nitride layer. If a thin layer of oxide or nitride layer is formed on the second metal layer, then it is removed at the step or wet etching the second metal layer. So, the contact between the ITO and the pad remains satisfactory after removing the photoresist pattern to expose the surface on the gate electrode.

Figure 1:
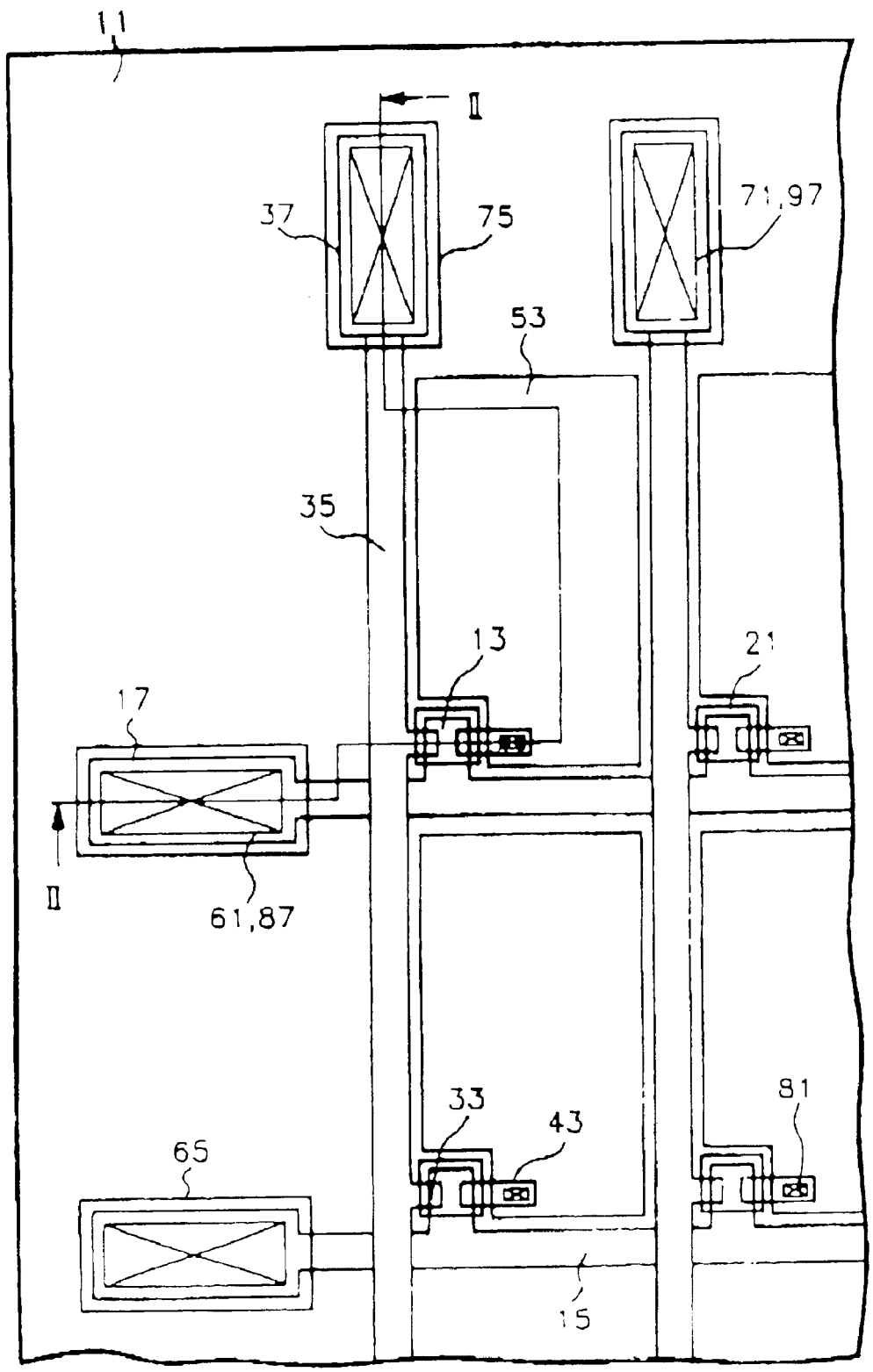
FIG. 1 shows a plan view of the conventional structure of a liquid crystal display device.
Figure 2A:
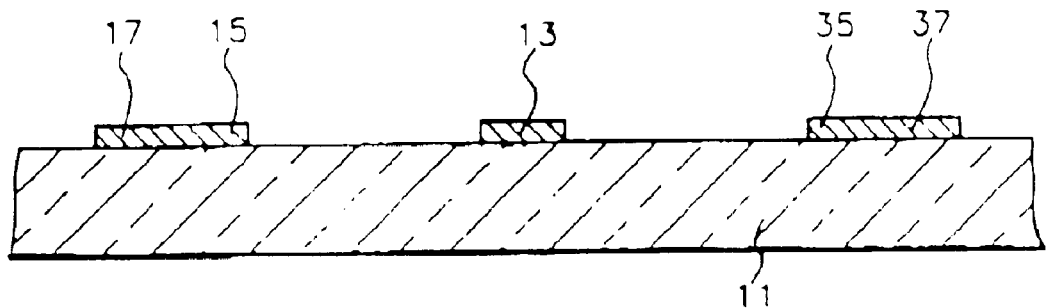
FIGS. 2a–2f are cross-sectional views showing the manufacturing process of a conventional active panel of an LCD.
Figure 2B:
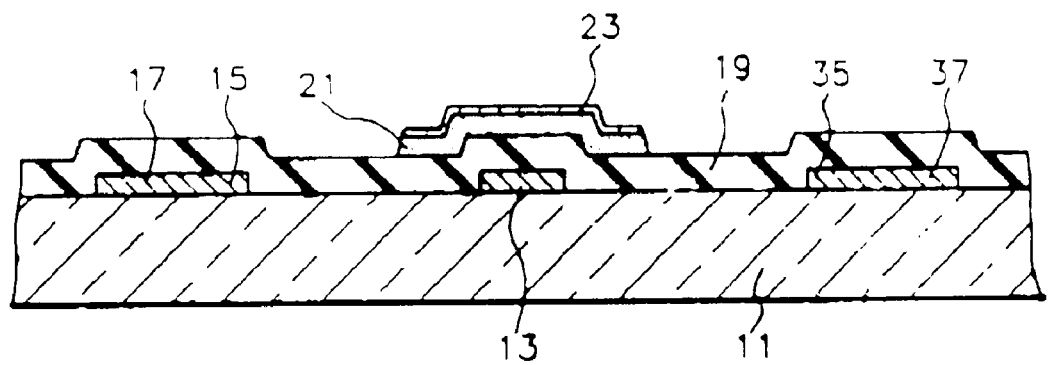
Figure 2C:
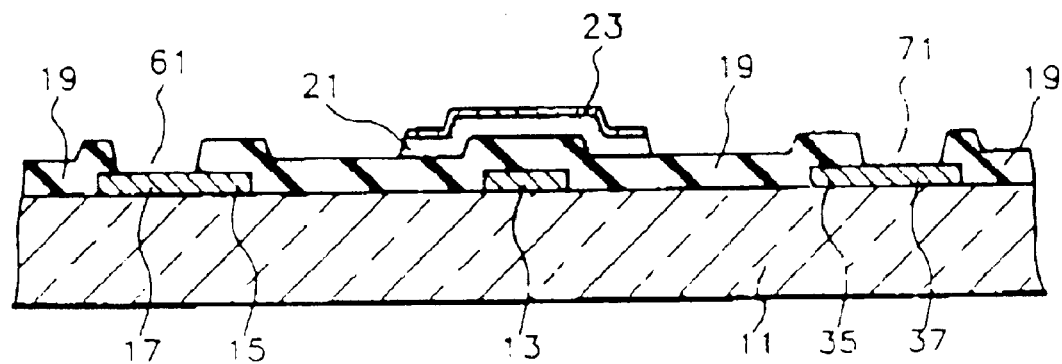
Figure 2D:
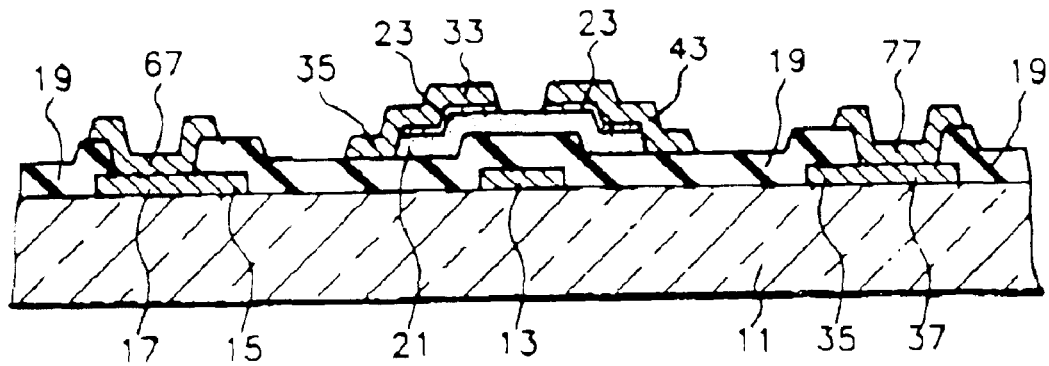
Figure 2E:
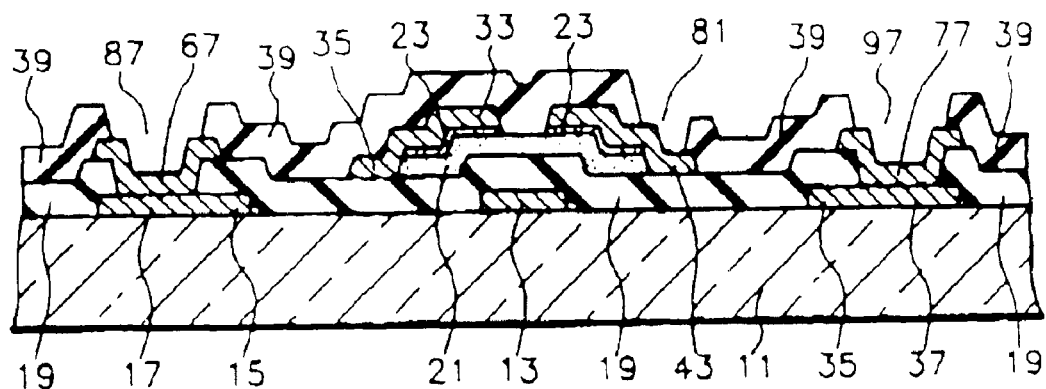
Figure 2F:
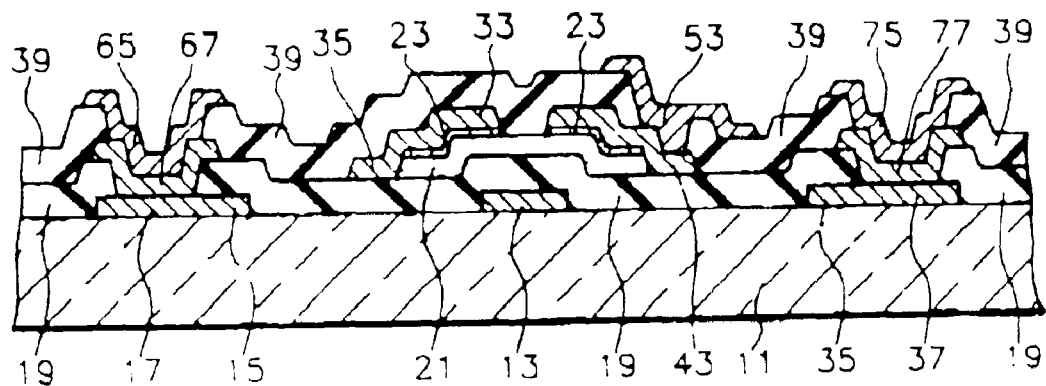
Figure 3:
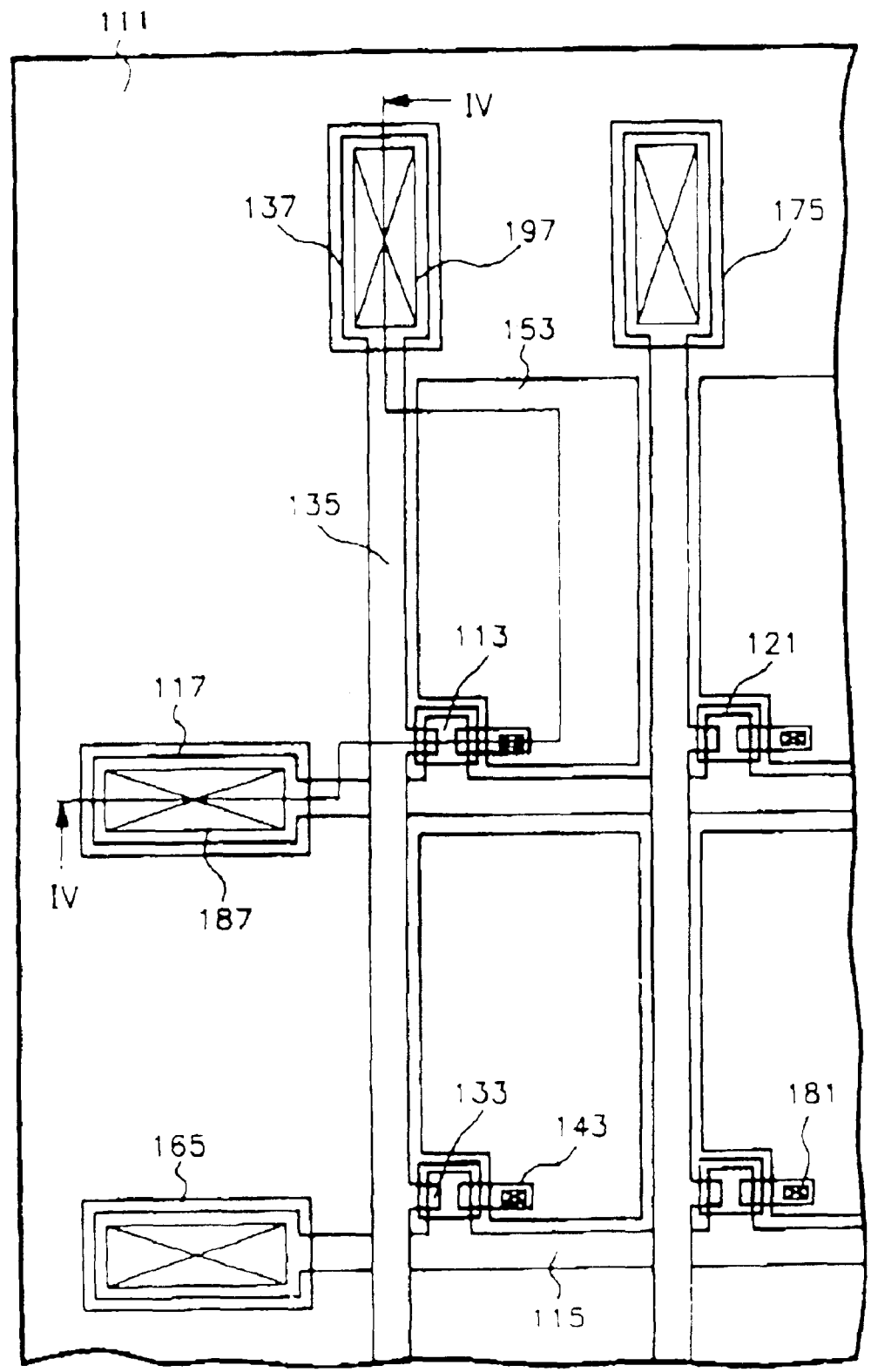
FIG. 3 shows a plan view of a structure of an LCD of the present invention.
Figure 4A:
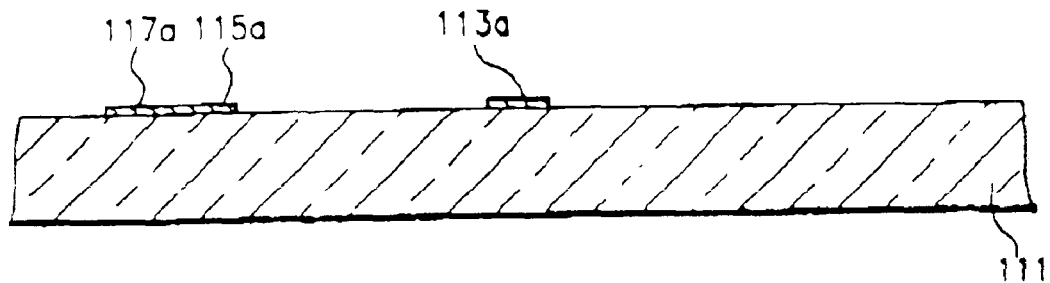
Figure 4B:
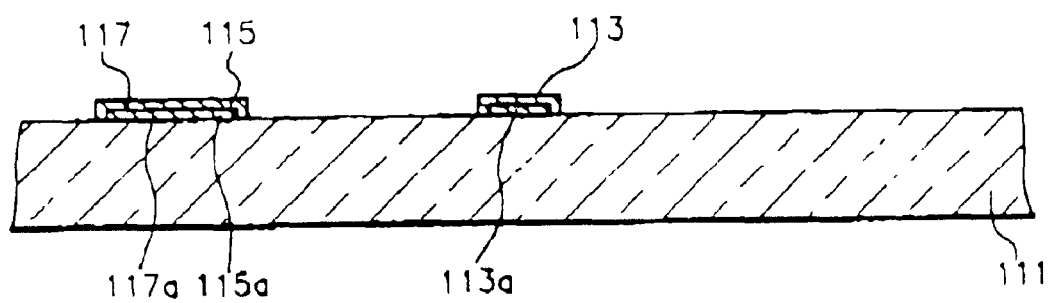

Referring to FIG. 3 showing a plan view of an active panel of the present invention and FIGS. 4a–4f showing cross-sectional views of the active panel along the line IV–IV to FIG. 3, this embodiment will now be described A first metal layer including aluminum is deposited on a transparent substrate 111 to form an aluminum layer. The aluminum layer is patterned to form a low resistance gate electrode 113a, a low resistance gate line 115a and a low resistance gate pad 117a, as shown in FIG. 4a.

A second metal layer including chromium or molybdenum is deposited on the substrate 111, the low resistance gate electrode 113a, the low resistance gate line 115a and the low resistance gate pad 117a. The second metal layer is patterned to form a second-metal gate electrode 113, a second-metal gate line 115, and a second-metal gate pad 117, as shown FIG. 4b. The second-metal gate electrode 113 is formed at one corner of a pixel. The second-metal gate line 115 connects the second-metal gate electrodes 113 arrayed in a row direction. The second-metal gate pad 117 is located at the end portion of the second-metal gate line 115. The second-metal gate electrode 113a, the second-metal gate line 115 and the second-metal gate pad 117 completely cover the low resistance second-metal gate electrode 113, the low resistance gate line 115a and the low resistance gate pad 117a, respectively.

Figure 4C:
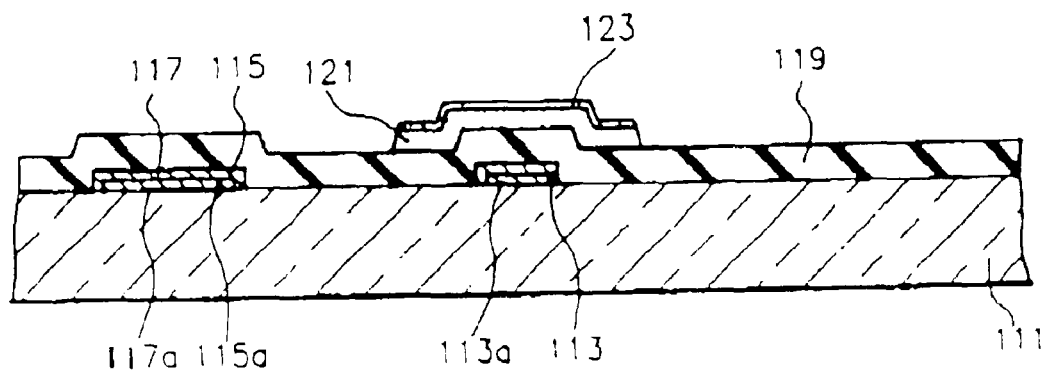

An insulation material such as silicon oxide or silicon nitride is deposited an the substrate 111, the second-metal bate electrode 113, the second-metal gate line 115, and the second-metal gate pad 117. An intrinsic semiconductor material and a doped semiconductor material are sequentially deposited thereon. The insulation material, the intrinsic semiconductor material and the doped semiconductor material are patterned to form a gate insulation layer 119, semiconductor layer 121, and a doped semiconductor layer 123, respectively, as shown in FIG. 4c.

Figure 4D:
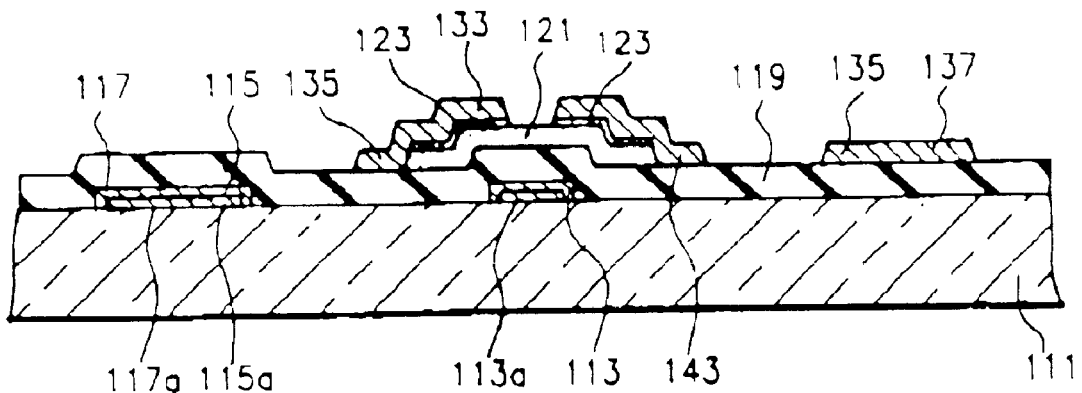

A third metal layer including chromium is deposited on the substrate 111, the semiconductor layer 121 and the doped semiconductor layer 113. The third metal layer is patterned to form a source electrode 133, a source line 135, a source pad 137, and a drain electrode 143. The source electrode 133 is formed in contact with a source region of the TFT, and the drain electrode 143 is formed in contact with a drain region of the TFT. The source electrode 133 and the drain electrode 143 are separated by a gap in the doped semiconductor layer 123. The source line 135 connects the source electrodes 133 arrayed in a column direction. The source pad 137 is located at an end portion of the source line 135. A part of the doped semiconductor layer 123 between the source electrode 133 and the drain electrode 143 is removed to divide the doped semiconductor layer 123 into two parts using the electrodes as a mask, as shown in FIG. 4d.

Figure 4E:
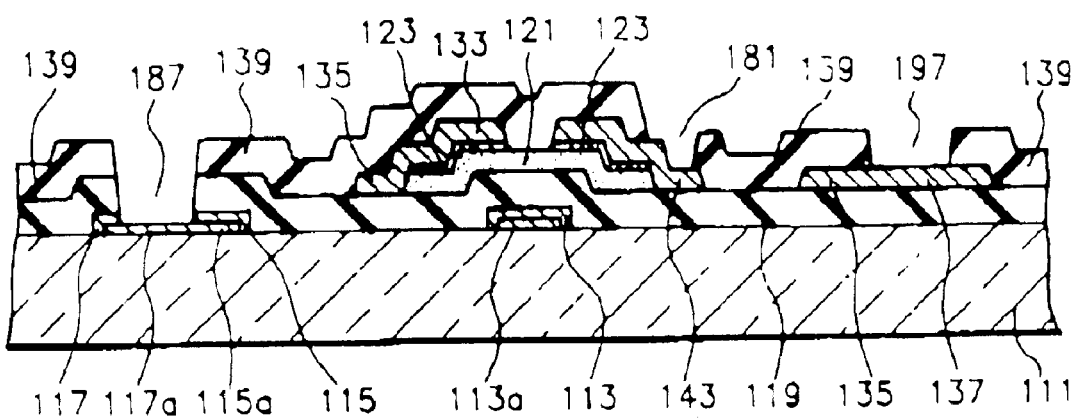

A protection layer 139 is formed by depositing an insulation material such as silicon nitride or silicon oxide on the substrate 111, the source electrode 133, the source line 135, the source pad 137, and drain electrode 143. The protection layer 139 is patterned to form a drain contact hole 181, a gate pad contact hole 187, and a source pad contact hole 197. The gate pad contact hole 187 exposes the second-metal gate pad 117 by removing the protection layer 139 and the gate insulation layer 119 covering the second-metal gate pad 117. When the gate pad contact hole 187 is formed, the source pad contact hole 197 is also formed by removing the protection layer 139 covering the source pad 137. Then, the exposed part of the second-metal gate pad 117 is removed by an etching method using the gate pad contact hole 187 as a mask, as shown in FIG. 4e.

Figure 4F:
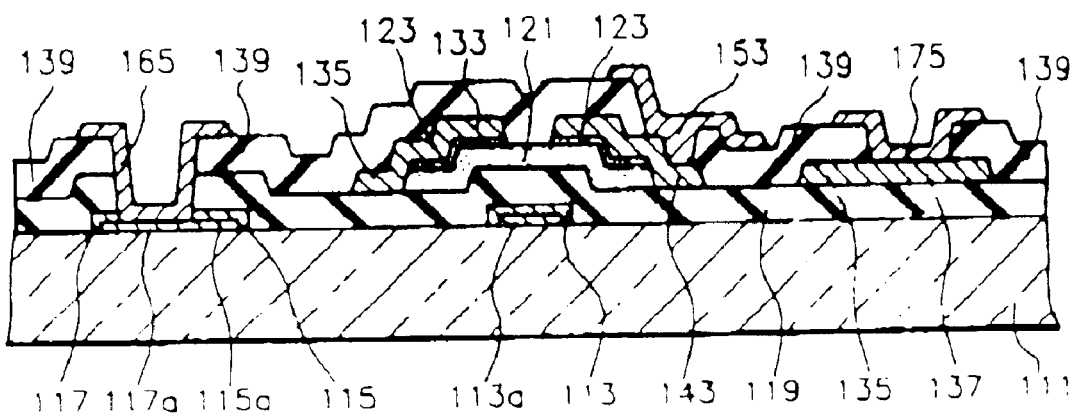

An indium tin oxide layer is deposited on the substrate 111 and the protection layer 139, and is patterned to form a pixel electrode 153, a gate pad terminal 165, and a source pad terminal 175. The pixel electrode 153 connects to the drain electrode 143 through the drain contact hole 181. The gate pad terminal 165 is connected to the low resistance gate pad 117a through the gate pad contact hole 187. The source pad terminal 175 is connected to the source pad 137 through the source pad contact hole 197, as shown in FIG. 4f.

According to this embodiment, the second-metal gate pad 117 includes a first metal layer including aluminum and a second metal layer including chromium or molybdenum. The second metal layer covers the first metal layer entirely. So, the hillock problem which occurs on an aluminum surface is prevented by the second metal layer.

A portion of the second-metal gate pad 117 exposed through the gate pad contact hole 187 is removed by a wet etching method. The gate pad terminal 165 is formed by depositing an ITO layer over it, and patterning the ITO layer. Therefore, the exposed surface of the second metal gate pad 117 is clear, and there are no contaminants such as chromium oxide, chromium nitride, molybdenum oxide, or molybdenum nitride between the second-metal gate pad 117 and the gate pad terminal 165.

Referring to FIG. 3 showing the plan view of the present invention and FIGS. 5a–5f showing cross-sectional views along the line IV—IV in FIG. 3 of a manufacturing process, another example of the present invention will be described.

Figure 5A:
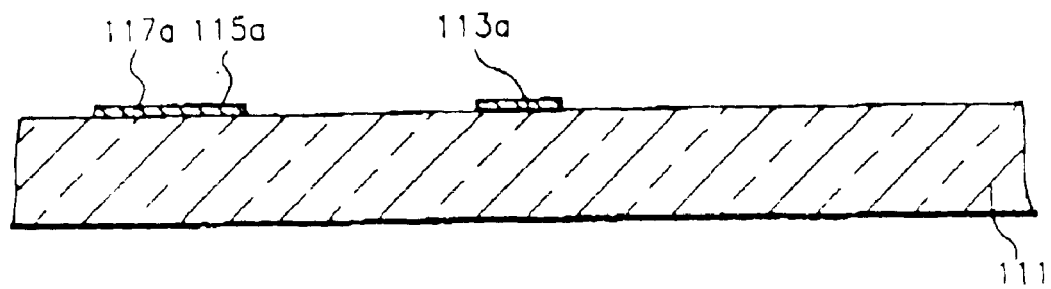
Figure 5B:
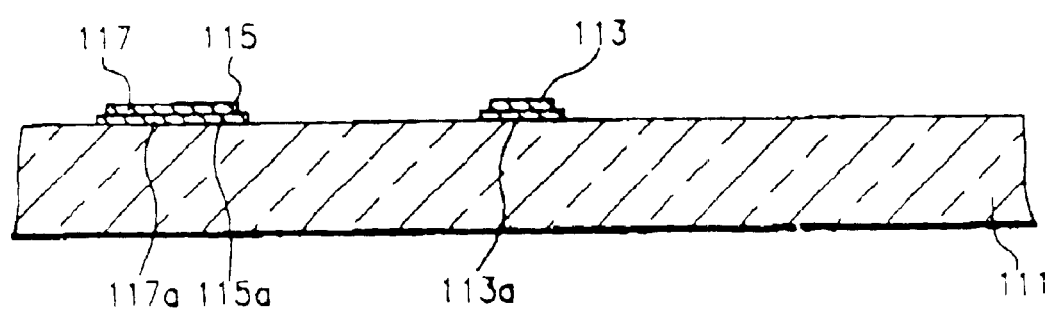

A first metal layer including aluminum is deposited on a transparent substrate 111 to form an aluminum layer. The aluminum layer is patterned to form a low resistance gate electrode 113a, a low resistance gate line 115a, and a low resistance gate pad 117a, as shown in FIG. 5a A second metal layer including chromium or molybdenum is deposited on the substrate 111, the low resistance gate electrode 113a, the low resistance gate line 115a and the low resistance gate pad 117a. The second metal layer is patterned to form a second-metal gate electrode 113, a second-metal gate line 115, and a second-metal gate pad 117, as shown in FIG. 5b. The second-metal gate electrode 113 is located at one corner of a pixel. The second-metal gate line 115 connects the gate electrodes 113 arrayed in a row direction. The second-metal ;ate pad 117 is located at the end of the second-metal gate line 115. The second-metal gate electrode 113, the second-metal gate line 115, and the second-metal gate pad 117 cover portions of the low resistance gate electrode 113a, the low resistance gate line 115a, and the low resistance gate pad 117a, respectively. Here, the covered portion of the aluminum metal layer is defined such that the hillock problem does not occur.

Figure 5C:
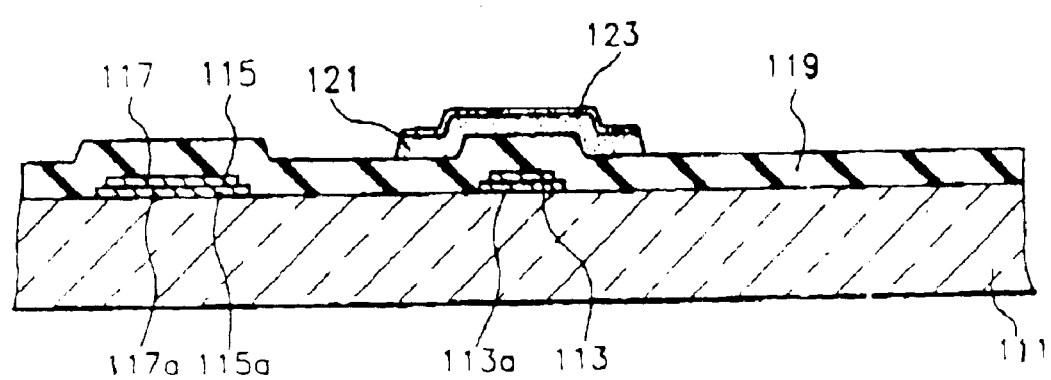

An insulation material such as silicon oxide or silicon nitride is deposited on the substrate 111, the second-metal gate electrode 113, the second-metal gate line 115, and the second-metal gate pad 117. The layer including the insulation material becomes a gate insulation layer 119. An intrinsic semiconductor material and a doped semiconductor material are sequentially deposited thereon. The intrinsic semiconductor material and the doped semiconductor material are patterned to form a semiconductor layer 121, and a doped semiconductor layer 123, as shown in FIG. 5c.

Figure 5D:
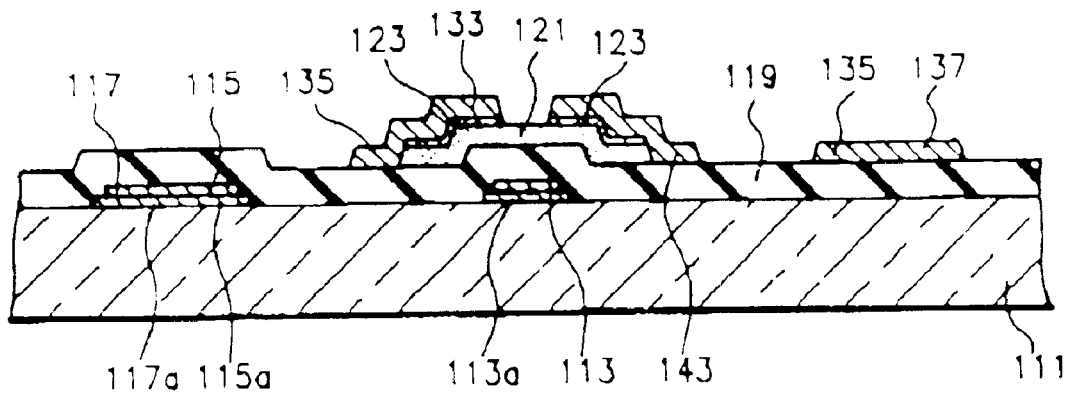

A third metal layer including chromium or molybdenum is deposited on the substrate 111, the semiconductor layer 121, and the doped semiconductor layer 123. The third metal layer is patterned to form a source electrode 133, a source line 135, a source pad 137, and a drain electrode 143 The source electrode 133 is formed in contact with a source region of the TFT, and the drain electrode 143 is formed in contact with a drain region of the TFT, wherein the source electrode 133 and the drain electrode 143 are separated by a gap in the doped semiconductor layer 123. The exposed part of the doped semiconductor layer 123 between the source electrode 133 and the drain electrode 143 is removed by etching, using the source electrode 133 and the drain electrode 143 as a mask, so the doped semiconductor layer 123 is divided into two parts, as shown in FIG. 5d. The source line 135 connects the source electrodes 133 arrayed in a column direction The source pad 137 is located at the end of the source line 135.

Figure 5E:
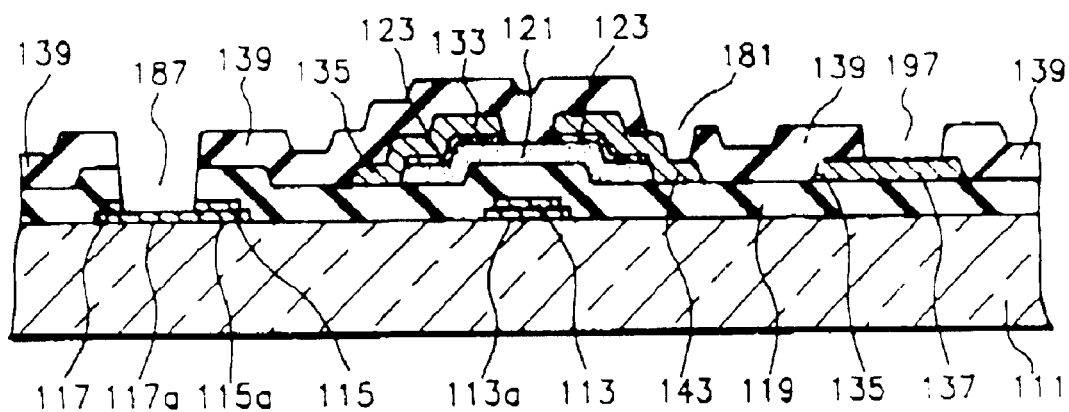

An insulation material such as silicon nitride or silicon oxide is deposited on the substrate 111, the source electrode 133, the source line 135, the source pad 137, and the drain electrode 143 to form a protection layer 139. The protection layer 139 is patterned to form a drain contact hole 181, a gate pad contact hole 187, and a source pad contact hole 197, as shown in FIG. 5e. The drain contact hole 181 exposes the drain electrode 143 by etching the protection layer 139 covering the drain electrode 143. The gate pad contact hole 187 exposes the second-metal gate pad 117 by etching the protection layer 139 and the gate insulation layer 119 covering the second-metal gate pad 117. The source pad contact hole 197 exposes the source pad 137 by etching the protection layer 139 covering the source pad 137. The exposed second-metal gate pad 117 is removed by an etching method using the gate pad contact hole 187 as a mask.

Figure 5F:
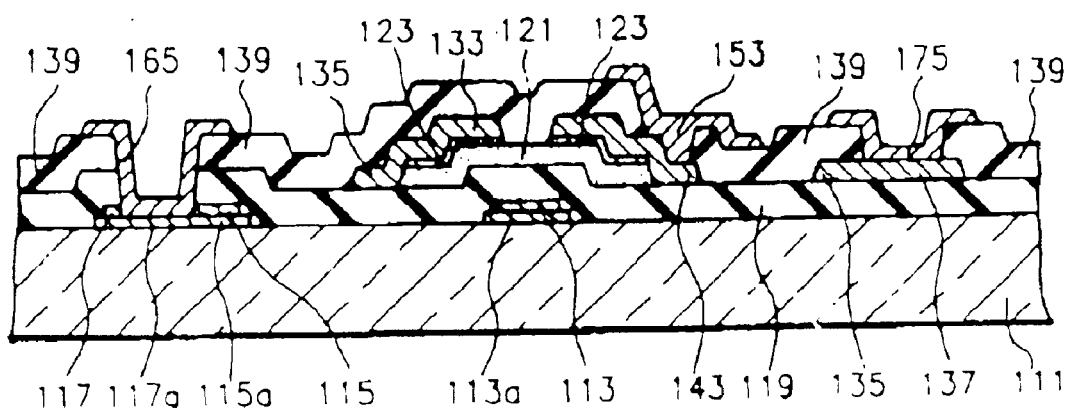

An indium tin oxide (ITO layer is deposited on the protection layer 139. The ITO layer is patterned to form a pixel electrode 153, a gate pad terminal 165, and a source pad terminal 175, as shown in FIG. 5f. The pixel electrode 153 is connected to the drain electrode 143 through the drain contact hole 181. The gate pad terminal 165 is connected to the low resistance gate pad 117a through the gate pad contact hole 187. The source pad terminal 175 is connected to the source pad 137 through the source pad contact hole 197.

According to this embodiment, the low resistance gate pad 117a includes a first metal layer including aluminum, and the second-metal gate pad 117 includes a second metal layer including chromium or molybdenum. The second metal layer covers the entire first metal layer, preventing a hillock from occurring on an aluminum surface.

The exposed part of the second-metal gate pad 117 is removed by a wet etching method. The gate pad terminal 165 formed by depositing an ITO layer over it and patterning the ITO layer. Thus, the exposed surface of the second-metal gate pad 117 is clear. Therefore, there is no contaminant such as chromium oxide, chromium nitride, molybdenum oxide, or molybdenum nitride between the second-metal gate pad 117 and the gate pad terminal 165.

This embodiment describes another example of a pad structure of an LCD and the manufacturing method for the same. According to the above preferred embodiments, the surface of a pad is a plane structure, as shown in FIGS. 4f and 5f. That embodiment describes a pad structure where contact resistance between the pad and a pad terminal is reduced and the adhesion between them is enhanced.

In order to improve contact resistance, the contact area will be enlarged. In the present invention, the surface of the pad has a raised part and a depressed part. In this embodiment, the pad contact hole has many small holes, rather than a single hole, as shown in FIG. 6. FIG. 6 shows a pad structure in which the pad has many small contact holes FIG. 7a shows a cross-sectional view of a pad having one contact hole, and FIG. 7b shows the cross sectional view of a pad having several small contact holes.

The ITO layer, which will become a pad terminal, is usually sputtered in an oxygen atmosphere. Here, a thin aluminum oxide layer will be formed on the exposed pad surface that includes aluminum. Aluminum oxide has high resistance to electrical current. Therefore, the existence of the aluminum oxide layer hinders electrical contact. In this embodiment, the gate pad contact hole 187 includes many small holes and the second-metal gate pad 117 is patterned by an etching method using the small holes as a mask. In spite of the fact that a thin aluminum oxide layer is formed on the exposed low resistance gate pad 111a which includes aluminum, the gate pad terminal 165 is also in contact with side portions of the etched second-metal gate pad 117 which includes chromium or molybdenum. The contact area is enlarged because of the uneven surface shape, and contact resistance between the second-metal gate pad 117 and the gate pad terminal 165 is reduced.

Furthermore, the small holes may have any shape, as shown in FIGS. 8a and 8b. The small holes may be formed over the entire pad part or some part of the pad.

While the invention has been described to detail and with reference to specific embodiments thereof, it will he apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A method for manufacturing a pad terminal for a semiconductor device comprising the steps of:

forming a first pad on a substrate using a first metal;

forming a second pad covering the first pad using a second metal;

forming a protection layer over the second pad;

forming a pad contact hole through the protection layer exposing an exposed portion of a surface of the second pad;

removing the exposed portion of the second pad using the pad contact hole as a mask thereby exposing an exposed portion of the first pad; and forming a conductive pad comprising a conductive material and connected to the exposed portion of the first pad, wherein the step of removing the exposed portion of the second pad is separate from the step of forming the pad contact hole, and wherein the first metal comprises aluminum.

2. A method for manufacturing a pad terminal for a semiconductor device comprising the steps of:

forming a first pad on a substrate using a first metal; forming a second pad covering the first pad using a second metal;

forming a protection layer over the second pad;

forming a pad contact hole through the protection layer exposing an exposed portion of a surface of the second pad;

removing the exposed portion of the second pad using the pad contact hole as a mask thereby exposing an exposed portion of the first pad; and forming a conductive pad comprising a conductive material and connected to the exposed portion of the first pad;

wherein the step of removing the exposed portion of the second pad is separate from the step of forming the pad contact hole, and wherein the second metal is selected from a group consisting of chromium and molybdenum.

3. A method for manufacturing a semiconductor display device comprising the steps of:

forming a gate line, a gate pad, and a gate electrode on a substrate, wherein the gate pad is located at an end portion of the gate line;

forming a gate insulation layer over the substrate, the gate line, the gate pad and the gate electrode;

forming a first semiconductor layer over a gate region;

forming a doped semiconductor layer over the first semiconductor layer;

forming a source electrode over a first portion of the doped semiconductor, a drain electrode over a second portion of the doped semiconductor layer, a source pad and a source line, wherein the source pad is located at an end portion of the source line;

removing a part of the doped semiconductor layer over the gate electrode;

forming a protection layer;

patterning the protection layer to expose a portion of a surface of the gate pad, a portion of a surface of the source pad, and a portion of the drain electrode;

removing an upper part of a portion of the exposed portion of the gate pad using the patterned protection layer as a mask; and forming a pixel electrode connected to the portion of the drain electrode, a gate pad terminal connected to the portion of the gate pad and a source pad terminal connected to the portion of the source pad, wherein the gate line, the gate pad and the gate comprise a bottom layer and a top layer, and wherein the bottom layer comprises aluminum.

4. A method for manufacturing a semiconductor display device comprising the steps of:

forming a gate line a gate pad, and a gate electrode on a substrate, wherein the gate pad is located at an end portion of the gate line;

forming a gate insulation layer over the substrate, the gate line, the gate pad and the gate electrode;

forming a first semiconductor layer over a gate region;

forming a doped semiconductor layer over the first semiconductor layer;

forming a source electrode over a first portion of the doped semiconductor, a drain electrode over a second portion of the doped semiconductor layer, a source pad and a source line, wherein the source pad is located at an end portion of the source line;

removing a part of the doped semiconductor layer over the gate electrode;

forming a protection layer;

patterning the protection layer to expose a portion of a surface of the gate pad, a portion of a surface of the source pad, and a portion of the drain electrode;

removing an upper part of a portion of the exposed portion of the gate pad using the patterned protection layer as a mask; and forming a pixel electrode connected to the portion of the drain electrode, a gate pad terminal connected to the portion of the gate pad and a source pad terminal connected to the portion of the source pad, wherein the gate line, the gate pad and the gate electrode comprise a bottom layer and a top layer, and wherein the top layer comprises a metal selected from a group consisting of chromium and molybdenum.

5. A method for manufacturing a semiconductor display device comprising the steps of:

forming a gate line, a gate pad, and a gate electrode on a substrate, wherein the gate pad is located at an end portion of the gate line;

forming a gate insulation layer over the substrate, the gate line, the gate pad and the gate electrode;

forming a first semiconductor layer over a gate region;

forming a doped semiconductor layer over the first semiconductor layer;

forming a source electrode over a first portion of the doped semiconductor, a drain electrode over a second portion of the doped semiconductor layer, a source pad and a source line, wherein the source pad is located at an end portion of the source line;

removing a part of the doped semiconductor layer over the gate electrode;

forming a protection layer;

patterning the protection layer to expose a portion of the gate pad, a portion of the source pad and a portion of the drain electrode; and forming a pixel electrode connected to the portion of the drain electrode, a gate pad terminal connected to the portion of the gate pad and a source pad terminal connected to the portion of the source pad, wherein the gate line, the gate pad and the gate electrode comprise a bottom layer and a top layer, and wherein the top layer covers the bottom layer completely.

6. A method for manufacturing a semiconductor display device comprising the steps of:

forming a gate line, a gate pad, and a gate electrode on a substrate, wherein the gate pad is located at an end portion of the gate line;

forming a gate insulation layer over the substrate, the gate line, the gate pad and the gate electrode;

forming a first semiconductor layer over a gate region;

forming a doped semiconductor layer over the first semiconductor layer;

forming a source electrode over a first portion of the doped semiconductor, a drain electrode over a second portion of the doped semiconductor layer, a source pad and a source line, wherein the source pad is located at an end portion of the source line;

removing a part of the doped semiconductor layer over the gate electrode;

forming a protection layer;

patterning the protection layer to expose a portion of the gate pad, a portion of the source pad and a portion of the drain electrode; and forming a pixel electrode connected to the portion of the drain electrode, a gate pad terminal connected to the portion of the gate pad and a source pad terminal connected to the portion of the source pad, wherein the gate line, the gate pad and the gate electrode comprise a bottom layer and a top layer, wherein the bottom layer comprises aluminum, and wherein the top layer covers the bottom layer completely.

7. A method for manufacturing a semiconductor display device comprising the steps of:

forming a gate line, a gate pad, and a gate electrode on a substrate, wherein the gate pad is located at an end portion of the gate line;

forming a gate insulation layer over the substrate, the gate line, the gate pad and the gate electrode;

forming a first semiconductor layer over a gate region;

forming a doped semiconductor layer over the first semiconductor layer;

forming a source electrode over a first portion of the doped semiconductor, a drain electrode over a second portion of the doped semiconductor layer, a source pad and a source line, wherein the source pad is located at an end portion of the source line;

removing a part of the doped semiconductor layer over the gate electrode;

forming a protection layer;

patterning the protection layer to expose a portion of the gate pad, a portion of the source pad and a portion of the drain electrode; and forming a pixel electrode connected to the portion of the drain electrode, a gate pad terminal connected to the portion of the gate pad and a source pad terminal connected to the portion of the source pad, wherein the gate line, the gate pad and the gate electrode comprise a bottom layer and a top layer, wherein the top layer comprises a metal selected from a group consisting of chromium and molybdenum, and wherein the top layer covers the bottom layer completely.

8. The method according to claim 3, wherein the top layer covers the bottom layer partially.

9. The method according to claim 4, wherein the top layer covers the bottom layer partially.

* * * * *